(12) United States Patent
Kries

(10) Patent No.: US 11,906,586 B2
(45) Date of Patent: Feb. 20, 2024

(54) CIRCUIT ARRANGEMENT FOR VOLTAGE TESTING AND PARTIAL DISCHARGE CAPTURE

(71) Applicant: Kries Energietechnik Gmbh & Co. KG, Waiblingen (DE)

(72) Inventor: Gunter Kries, Weinstadt (DE)

(73) Assignee: Kries Energietechnik GmbH & Co. KG, Waiblingen (DE)

( * ) Notice: Subject to any disclaimer, the term of this patent is extended or adjusted under 35 U.S.C. 154(b) by 147 days.

(21) Appl. No.: 17/452,920

(22) Filed: Oct. 29, 2021

(65) Prior Publication Data

US 2022/0260636 A1 Aug. 18, 2022

(30) Foreign Application Priority Data

Feb. 16, 2021 (DE) ..................... 10 2021 201 465.8

(51) Int. Cl.
*G01R 31/327* (2006.01)
*G01R 19/165* (2006.01)

(52) U.S. Cl.
CPC ... *G01R 31/3274* (2013.01); *G01R 19/16576* (2013.01)

(58) Field of Classification Search
None
See application file for complete search history.

(56) References Cited

U.S. PATENT DOCUMENTS 5,247,258 A 9/1993 Tripier et al.
6,130,540 A 10/2000 Achatz
(Continued)

FOREIGN PATENT DOCUMENTS

DE 101 34 790 A1 1/2003
DE 103 04 396 A1 7/2004
(Continued)

OTHER PUBLICATIONS

Ziegler Juergen et al.; Electrical operating and test and display circuit, especially for medium and high voltage switching installations; DE10304396A1; Publication Date: Jul. 29, 2004; Kries Energietechnik Gmbh & Co; (Year: 2004).*
(Continued)

*Primary Examiner* — Nasima Monsur
(74) *Attorney, Agent, or Firm* — Barley Snyder

(57) ABSTRACT

A circuit arrangement for voltage testing and partial discharge capture in a single-phase or multi-phase medium-voltage or high-voltage installation includes one or more conductor signal inputs that are couplable to respective capacitive coupling electrodes that are coupled to respective conductors of the installation, a voltage testing unit coupled to the relevant conductor signal input and configured for threshold-based voltage state capture, a partial discharge detector unit, and an energy supply for the partial discharge detector unit with a first energy supply circuit for supplying energy from the relevant conductor signal input and/or with a second energy supply circuit for supplying energy from the relevant conductor signal input. An input side of the partial discharge detector circuit is couplable via a partial discharge connection path to an earth side of an installation system capacitance that is electrically parallel to the capacitive coupling electrode.

16 Claims, 1 Drawing Sheet

(56) References Cited

U.S. PATENT DOCUMENTS

| | | | |
|---|---|---|---|
| 6,420,879 B2* | 7/2002 | Cooke | G01R 31/1227 |
| | | | 324/501 |
| 10,692,584 B2 | 6/2020 | Busi et al. | |
| 2016/0161543 A1* | 6/2016 | Andle | G01R 31/14 |
| | | | 324/551 |
| 2019/0056447 A1 | 2/2019 | Candela et al. | |
| 2020/0003804 A1* | 1/2020 | Maret | G01R 21/133 |

FOREIGN PATENT DOCUMENTS

| | | |
|---|---|---|
| DE | 203 20 394 U1 | 7/2004 |
| DE | 297 24 824 U1 | 8/2004 |
| DE | 20 2004 012 798 U1 | 12/2004 |
| DE | 20 2013 002 563 U1 | 5/2013 |
| DE | 10 2020 214 614 B3 | 5/2021 |
| EP | 0 428 601 B1 | 10/1993 |
| WO | WO 97/07411 A1 | 2/1997 |
| WO | WO 2017/144091 A1 | 8/2017 |

OTHER PUBLICATIONS

Extended European Search Report issued in European Application No. 22151847.5 dated Jul. 18, 2022 (eight (8) pages).

* cited by examiner

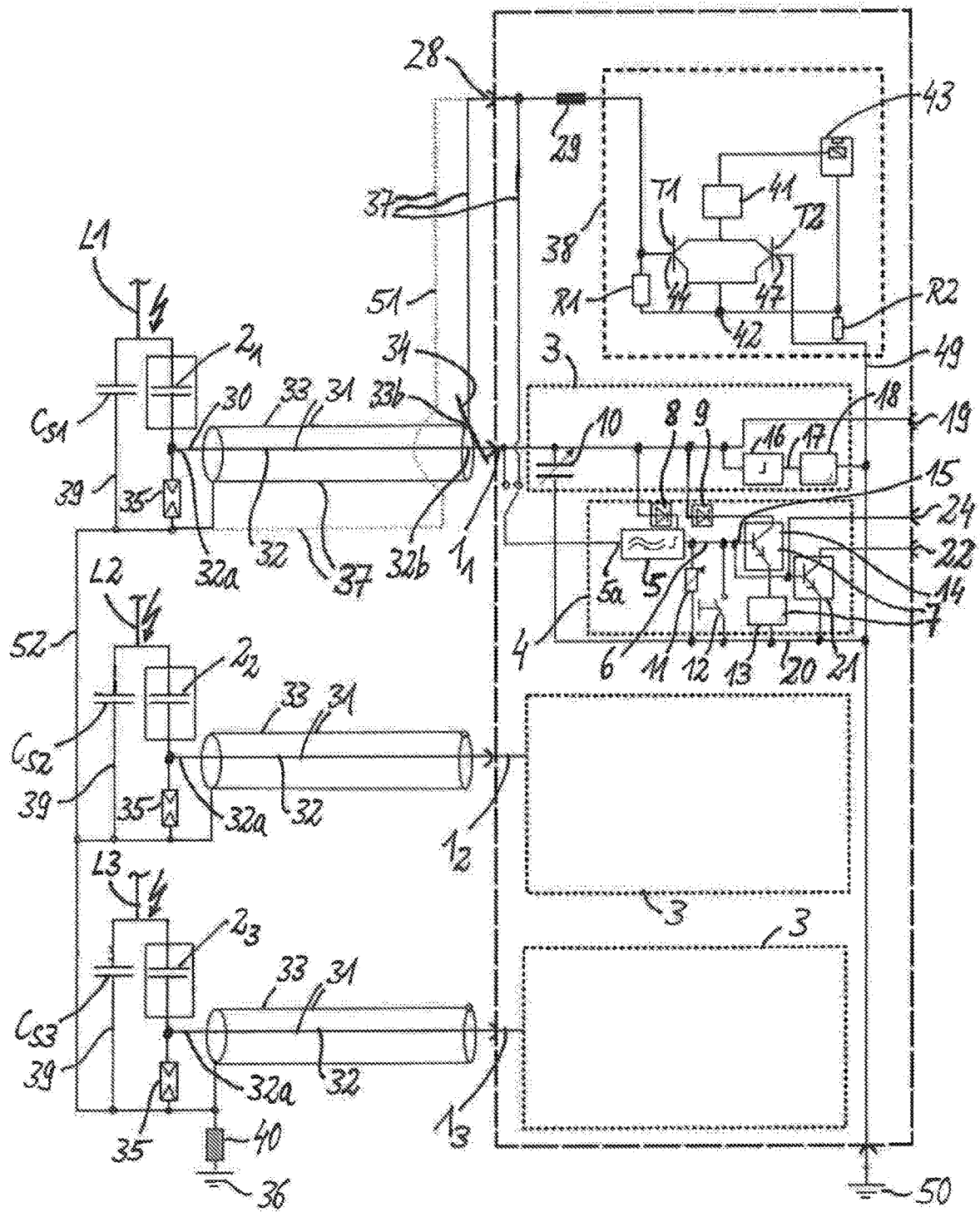

CIRCUIT ARRANGEMENT FOR VOLTAGE TESTING AND PARTIAL DISCHARGE CAPTURE

CROSS REFERENCE TO RELATED APPLICATION

This application claims priority under 35 U.S.C. § 119 from German Patent Application No. 102021201465.8, filed Feb. 16, 2021, the entire disclosure of which is herein expressly incorporated by reference.

BACKGROUND AND SUMMARY OF THE INVENTION

The invention relates to a circuit arrangement for voltage testing and partial discharge capture in a single-phase or multi-phase medium-voltage or high-voltage installation. The circuit arrangement comprises one or a plurality of conductor signal inputs, each of which being configured for coupling to a respective capacitive coupling electrode that is coupled to a respective conductor of the single-phase or multi-phase medium-voltage or high-voltage installation. Further, the circuit arrangement comprises at least one voltage testing unit coupled on an input side to the or an assigned one of the conductor signal inputs of the circuit arrangement and configured for threshold-based voltage state capture with respect to the assigned conductor, at least one partial discharge detector unit configured for partial discharge detection with respect to the conductor or an assigned one of the conductors and comprising a partial discharge detector circuit and a partial discharge display circuit coupled on an input side to a signal output of the partial discharge detector circuit, and an energy supply for the partial discharge detector unit comprising at least one of a first energy supply circuit configured to supply the partial discharge detector circuit with energy from the conductor signal input or one of the conductor signal inputs of the circuit arrangement and a second energy supply circuit configured to supply the partial discharge display circuit with energy from the conductor signal input or one of the conductor signal inputs of the circuit arrangement.

Single-phase or multi-phase medium-voltage or high-voltage installations, in particular in the form of what are known as medium-voltage or high-voltage switchgear, contain, as is known, a number of voltage-carrying electrical lines, known for short as conductors, corresponding to the number of phases. In the usual three-phase systems, this consequently involves three conductors, which are most often known in abbreviated form as L1, L2 and L3.

The circuit arrangement serves in such installations on the one hand for threshold-based voltage testing, in particular in accordance with the standard IEC 61243-5, and contains one or a plurality of conductor signal inputs, each of which is configured for coupling to a respective capacitive coupling electrode that for its part is coupled to a respective conductor of the single-phase or multi-phase medium-voltage or high-voltage installation. A voltage testing unit is coupled on the input side at the respective conductor signal input of the circuit arrangement and is configured for threshold-based voltage state capture with respect to the associated conductor.

On the other hand, the circuit arrangement serves in such installations for the detection of partial discharges at a respective conductor and for this purpose contains at least one partial discharge detector unit configured for partial discharge detection with respect to the assigned conductor and comprising a partial discharge detector circuit and a partial discharge display circuit coupled on the input side to a signal output of the partial discharge detector circuit.

In addition, the circuit arrangement comprises a suitable energy supply for the partial discharge detector unit, wherein the energy supply for the partial discharge detector unit comprises a first energy supply circuit configured to supply the partial discharge detector circuit with energy from the conductor signal input or one of the conductor signal inputs of the circuit arrangement and/or a second energy supply circuit configured to supply the partial discharge display circuit with energy from the conductor signal input or one of the conductor signal inputs of the circuit arrangement. The capture and display of partial discharges on a respective conductor of the medium-voltage or high-voltage installation is possible if the first energy supply circuit is present without auxiliary energy for the partial discharge detector circuit and if the second energy supply circuit is present without auxiliary energy for the partial discharge display circuit. Auxiliary energy is to be understood here as any electrical energy that is not drawn via the respective conductor signal input of the circuit arrangement, but is provided in some other way, for example by a battery or a mains voltage terminal of a device containing the circuit arrangement. Compared to this kind of use of auxiliary energy, this brings the advantage that no servicing-intensive batteries are needed, and no interfering signals that could be incorrectly interpreted as partial discharge signal, and that are often caused by switch-mode power supplies that are used for the connection of such devices to mains voltage, need to be taken into consideration.

A circuit arrangement of this general type mentioned at the beginning is disclosed in patent publication DE 10 2020 214 614.4. In the circuit arrangement therein, the partial discharge detector circuit is coupled on the input side to the or one of the conductor signal inputs of the circuit arrangement and through this to the relevant capacitive coupling electrode, in order to access the partial discharge signal there.

Furthermore, various similar circuit arrangements are known which, however, use auxiliary energy in the form of external electrical energy or electrical energy additionally made available for coupling to the respective conductor of the medium-voltage or high-voltage installation to supply the partial discharge detector unit. A conventional implementation of this sort is disclosed, for example, in laid-open publication DE 101 34 790 A1. An amplifier unit, which needs to be supplied with external energy, is thus often used in the partial discharge detector circuit. And the partial discharge display circuit is also often designed in conventional implementations such that it needs auxiliary energy. For example, in patent publication EP 0 428 601 B1 and laid-open publication WO 97/07411 A1 circuit arrangements for partial discharge capture are disclosed which need external auxiliary energy for the signal processing of the partial discharge capture and/or for the display of the partial discharge information obtained.

Laid-open publication WO 2017/144091 A1 discloses a circuit arrangement for partial discharge capture at an electrical object such as a cable connection of two high-voltage cables, wherein a battery or a power supply unit or a magnetic coil can be used for energy supply of the circuit arrangement, with which electrical energy can be tapped off inductively at one of the two high-voltage cables.

For what are known as voltage testing systems, which are circuit arrangements only for threshold-based voltage state capture without partial discharge capture, embodiments with and without auxiliary energy are known and are described, for example, in the standards VDE0682T415 and IEC61243-5. Patent publication DE 103 04 396 B4 discloses such a voltage testing system comprising energy supply means that can be operated by the user in order to be able to provide auxiliary energy to the system when actuated by the user.

A variety of voltage testing systems for voltage testing in medium-voltage or high-voltage installations are also already known which in addition have means for detecting a conductor break on the test signal connecting line from the capacitive coupling electrode to the conductor signal input of the test circuit, such as for example disclosed in the utility model publications DE 203 20 394 U1, DE 297 24 824 U1 and DE 20 2004 012 798 U1. Installation monitoring means are proposed for this purpose in the utility model document DE 20 2013 002 563 U1, which are designed such that they can detect a high-resistance malfunction both of the test signal connecting line as well as of an earth connection.

The invention is based on the technical problem of providing a circuit arrangement of the type mentioned at the beginning that offers advantages in particular in respect of its partial discharge detection capability over the prior art described above.

The invention solves this problem through the provision of a circuit arrangement for voltage testing and partial discharge capture in a single-phase or multi-phase medium-voltage or high-voltage installation that has specific advantageous features.

The circuit arrangement according to the invention comprises, in addition to the features mentioned at the outset, a partial discharge connection path configured to couple an input side of the partial discharge detector circuit to an earth side of an installation system capacitance that is electrically parallel to the capacitive coupling electrode. The term installation system capacitance refers here to one consisting of electrical capacitances of cables or lines possibly located there, i.e. in the vicinity of the relevant capacitive coupling electrode of the system of the medium-voltage or high-voltage installation, and of electrical capacitances of terminations possibly located there, in particular what are known as plug-in terminations. This installation system capacitance can arise in the present case for example to a significant extent if a high-voltage cable is connected at a switchgear field of the medium-voltage or high-voltage installation and the capacitive coupling electrode is dimensioned with a relatively small capacitance. Capacitances that result from field control coverings of high-voltage cable connector plugs and/or from shield covers of high-voltage cables contribute in particular to the installation system capacitance, and are always present in a medium-voltage installation as soon as the medium-voltage cable is connected to the installation, wherein this installation system capacitance can often be significantly larger than the coupling capacitance of the respectively present capacitive coupling electrode. It has been shown that it is precisely also in such cases that the partial discharge capture via the partial discharge connection path carried out by the partial discharge detector circuit offers advantages over a different kind of partial discharge capture, such as by coupling the partial discharge detector circuit to the relevant capacitive coupling electrode or to the associated conductor signal input of the circuit arrangement that is coupled to this coupling electrode.

If necessary, the circuit arrangement can be realized in a single device that enables a combined voltage testing and partial discharge capture, and is suitable both for single-phase and for multi-phase, in particular three-phase, medium-/high-voltage systems.

The circuit arrangement also makes it possible to draw the electrical energy required for operation of the partial discharge detector unit and, in particular, of its partial discharge detector circuit and/or its partial discharge display circuit, preferably entirely, alternatively partially, from the measurement signal present at the associated conductor signal input of the circuit arrangement, in particular from its low-frequency signal component.

The circuit arrangement furthermore offers the advantage that an active partial discharge capture, consisting of the evaluation of the input signal that is present and the display of the result of the evaluation, can itself remain restricted to the only interesting time periods in which the measurement signal is effectively applied at the relevant conductor signal input of the circuit arrangement, this meaning that the measurement signal is present with a sufficient signal magnitude or signal strength for the voltage testing by the voltage testing unit. During inactive time periods in which this active measurement signal is not present, reflecting a corresponding voltage-carrying activity on the associated conductor of the medium-voltage or high-voltage installation, partial discharge capture is not required. In that the partial discharge detector circuit and/or the partial discharge display circuit is or are supplied with energy via the first or second energy supply circuit from the measurement signal present at the conductor signal input of the circuit arrangement, one or both of these components for the partial discharge capture itself remains inactive due to the absence of sufficient energy supply, for as long as an active measurement signal is not present at the conductor signal input.

Due to this energy supply of the partial discharge detector unit from the same measurement signal that is supplied to the voltage testing unit, the energy supply for the detection and display of partial discharges via the first or second energy supply circuit can consequently be maintained in an adjustable dependency on the magnitude or strength of the measurement signal for the voltage testing so that, for example, below a minimum threshold for the presence of the voltage detected by the voltage testing unit, the detection and display of partial discharges is automatically suppressed. This additionally automatically protects against an incorrect partial discharge detection resulting from high-frequency interference signals or interference, whose frequency lies significantly above the usual grid frequency of the normal, low-frequency measurement signal, coupled into the conductor signal input of the circuit arrangement. This is because, in the absence of an active measurement signal, the partial discharge detector unit remains inactive due to a lack of sufficient energy supply, and therefore insensitive to these interfering signals. In other words, the energy supply of the partial discharge capture from the measurement signal for the voltage testing makes it possible only to evaluate the partial discharge capture for signals coupled in with a specific low-frequency grid-frequency signal in respect of partial discharge, while high-frequency interference coupled in without a low-frequency signal component does not bring about a partial discharge display.

In order to keep the energy requirement for the partial discharge detection low, it is possible in appropriate realizations through appropriate design of the partial discharge detector unit for the evaluation of the partial discharge capture to consist simply in the specification of a plurality of discrete different partial discharge levels and establishing—as well as appropriately reporting or indicating—which of these levels is currently present. In a simplest embodiment, this can be a purely binary, two-level reporting and display that only indicates whether or not a partial discharge is present.

In a corresponding embodiment, the circuit arrangement is able to perform the voltage testing and the partial discharge capture in the context of a combined multi-phase testing and display system. The circuit arrangement can, in particular, comprise the assigned voltage testing unit for each of a plurality of conductors of the respective medium-voltage or high-voltage installation that is to be monitored, or only for a portion of all the conductors of this installation. The circuit arrangement can, analogously, depending on requirements, comprise the respectively assigned partial discharge detector unit for each of a plurality of conductors of the medium-voltage or high-voltage installation, or only for one conductor or only for a portion of all the conductors of the installation. Using the partial discharge detector unit only at one of a plurality of phases of a multi-phase system minimizes the circuit complexity and the energy requirement. While using the partial discharge detector unit at a plurality or all the phases does increase the circuit complexity, it can however, if necessary, improve the reporting or display selectivity in respect of partial discharges.

When dimensioning the circuit arrangement, it is useful if the energy-consuming components of the partial discharge detector unit, i.e. the partial discharge detector circuit and the partial discharge display circuit, are implemented in a sufficiently high-resistance manner, so that their presence leaves the response behaviour of the voltage testing unit largely unchanged. In addition, such a high-resistance design of the partial discharge detector unit contributes to a minimum energy requirement of that unit, which can be covered without difficulty by way of the first and/or the second energy supply circuit from the measurement signal at the relevant conductor signal input.

In a development of the invention, the circuit arrangement contains a changeover switch for the switchable connection of an input side of the partial discharge detector circuit either to the partial discharge connection path or to the conductor signal input or one of the conductor signal inputs of the circuit arrangement, via which the assigned voltage testing unit is coupled to the capacitive coupling electrode. This advantageously enables an optional partial discharge capture via the partial discharge connection path and the earth side of the installation system capacitance, in particular in situations where the installation system capacitance is relatively high in relation to the capacitance of the coupling electrode, or with a relatively small coupling electrode capacitance, or via the relevant conductor signal input of the circuit arrangement and the capacitive coupling electrode, in particular in cases with a relatively high capacitance of the coupling electrode or a sufficiently high partial discharge signal level at the coupling electrode. It can, alternatively, be provided that the partial discharge capture is performed exclusively via the partial discharge connection path.

In a development of the invention, the circuit arrangement contains a coaxial line with an inner conductor that forms at least a part of a connecting line from the respective conductor signal input to the assigned capacitive coupling electrode, and an outer conductor that surrounds the inner conductor and forms at least a part of the partial discharge connection path. This advantageously enables the combination of a screened coupling of the relevant conductor signal input, and thereby the voltage testing by the voltage testing unit via the inner conductor at the capacitive coupling electrode, with utilization of the outer conductor for coupling the partial discharge detector unit to the earth side of the installation system capacitance. The connection from the conductor signal input to the capacitive coupling electrode can alternatively be realized by a non-coaxial line. The partial discharge connection path can, furthermore, alternatively contain a separate connection path line instead of using the outer conductor of the coaxial line for this purpose.

In a development of the invention, the earth side of the installation system capacitance and the partial discharge connection path coupled to this are connected to an earth potential via a high-frequency blocking element. The high-frequency blocking element can contribute to keeping the partial discharge signal at the earth side of the installation system capacitance sufficiently high by preventing it from being dissipated via the earth potential. Alternatively, the high-frequency blocking element can be omitted in certain applications or replaced by a suitably large length of an associated connecting line.

In an embodiment of the invention, the first energy supply circuit can be coupled to the same conductor signal input of the circuit arrangement as the partial discharge detector unit or to another of a plurality of conductor signal inputs of the circuit arrangement. The first-mentioned alternative is given for single-phase systems and can also be provided for multi-phase systems if necessary, if access of the energy supply circuit for the partial discharge detector unit to a conductor signal input other than the one that may be used by the partial discharge detector unit is unwanted. The other alternative can be advantageous in multi-phase systems in order, for example, to distribute the energy drawn by the circuit arrangement as evenly as possible over a plurality of conductors of the medium-/high-voltage installation.

In an embodiment of the invention, the second energy supply circuit can be coupled to the same conductor signal input of the circuit arrangement as the partial discharge detector unit or to another of a plurality of conductor signal inputs of the circuit arrangement. Here too, this measure can be advantageous for the second energy supply circuit in the one or the other alternative, depending on the application, as explained above for the first energy supply circuit.

In a corresponding realization in particular, the partial discharge detector unit, the first energy supply circuit and the second energy supply circuit can be coupled to three different conductor signal inputs of the circuit arrangement. This embodiment can be advantageous for a three-phase system in particular, wherein it balances the energy consumption from the different conductors and loads the voltage testing units that are preferably provided for all three conductors very evenly over all three conductors or phases. This contributes to the ability for an approximately uniform response threshold to be specified for the voltage testing across all three phases or conductors, without additional complexity.

In a development of the invention, the circuit arrangement comprises a variable capacitor at the respective conductor signal input to form a capacitive voltage divider with the assigned capacitive coupling electrode. With this variable capacitor, i.e. a capacitor with a variably adjustable capacitance, the response threshold for the voltage testing by the voltage testing unit and the sensitivity for the partial discharge capture by the partial discharge detector unit can, if necessary, be set variably, i.e. adjusted. With larger capacitance of the variable capacitor, the partial discharge capture becomes less sensitive, and as this capacitance is made smaller it becomes more sensitive. Since the response thresholds for the voltage testing according to the standard IEC61243-5 for non-response or response of the voltage display have a relatively high tolerance, namely 10% to 45%, the capacitance of the variable capacitor can be varied over a correspondingly large range in order to change the sensitivity of the partial discharge capture, without infringing the response thresholds of the voltage display according to this standard.

In a development of the invention, the partial discharge detector unit is made to have an adjustable sensitivity. The adjustability of the sensitivity of the partial discharge detector unit can be used advantageously, for example, to set a response level for the partial discharge detection to be sufficiently high, in accordance with the given system, to avoid erroneous indications, that can originate from background noise that is caused by high-frequency external interference that often occurs in practice. The partial discharge detector unit for adjusting the sensitivity comprises a circuit component coupled to the signal output of the partial discharge detector circuit and comprising a variable capacitor or a potentiometer or an adjustable resistor network, i.e. a network consisting of ohmic resistors with a variably adjustable total ohmic resistance. In addition or as an alternative to the mentioned arrangement of a variable capacitor at the conductor signal input, this represents an advantageous possible way of realizing the sensitivity adjustment with respect to the partial discharge capture. The voltage testing unit remains unaffected by this variant of the sensitivity adjustment of the partial discharge detection, and so with this variant the sensitivity of the partial discharge detection can also be adjusted, as required, over and beyond the range which, with a corresponding adjustment of the capacitance of the variable capacitor at the conductor signal input, does not yet lead to infringing of the response thresholds according to the standard for the voltage display of the voltage testing.

In a development of the invention, the partial discharge detector unit comprises a deactivation element with which the partial discharge detector unit can be deactivated independently of the voltage testing unit coupled to the same conductor signal input of the circuit arrangement. The partial discharge detector unit can be deactivated when required with this deactivation element, while the voltage testing unit can remain active. This enables, when desired, voltage tests by the voltage testing unit in periods of time within which the partial discharge detector unit is deactivated, so that the voltage testing can be kept completely unaffected by the partial discharge detector unit.

In a development of the invention, the partial discharge display circuit comprises a display unit and a controllable switch connected between the display unit and the second energy supply circuit and coupled to a control input at the signal output of the partial discharge detector circuit. This represents a realization of the circuit for the partial discharge display circuit that is advantageous in respect of energy consumption and necessary display functionality, requiring only a low level of circuit complexity.

In a development of the invention, the circuit arrangement contains a detection information terminal for transmitting detection information of the partial discharge detector unit to the outside and a controllable switch that is connected to the detection information terminal, wherein a control input of the controllable switch is connected to the signal output of the partial discharge detector circuit. Information relating to a detected partial discharge can be transmitted to the outside via the detection information terminal. Alternatively, the output signal of the switch can of course also be used inside the device for the connection of a remote transmission circuit, for example by means of a radio transmitter, so that the partial discharge signal is reported by radio to a remote control system.

In a development of the invention, the circuit arrangement contains a diagnostic terminal that is connected to the signal output of the partial discharge detector circuit. When the presence of a partial discharge is detected, the associated partial discharge signal present at the signal output of the partial discharge detector circuit can be accessed via the diagnostic terminal, for example in order to investigate it externally by means of an oscilloscope with the aim of diagnosing the cause of the partial discharge.

In a development of the invention, the respective voltage testing unit comprises a voltage testing circuit coupled on the input side to the assigned conductor signal input of the circuit arrangement, and a voltage state display circuit coupled on the input side to a signal output of the voltage testing circuit. The partial discharge display circuit of the partial discharge detector unit and the voltage state display circuit of the voltage testing unit coupled to the same conductor signal input of the circuit arrangement here have a common display unit. The voltage testing unit and the partial discharge detector unit thus advantageously share a common display unit, which contributes to keeping the circuit complexity and the energy requirement for the circuit arrangement low.

In an embodiment of the invention, the circuit arrangement comprises a connecting line monitoring circuit that can be coupled to a second end of the outer conductor that faces away from the coupling electrode and is configured to detect a deviation of the potential on the outer conductor. The connecting line monitoring circuit realizes an installation monitoring means with which a high-resistance malfunction of the outer conductor can be detected, which in particular can be caused by a conductor break of the coaxial line, and which typically is also associated with a high-resistance malfunction of the inner conductor and thereby of the connecting line. The term "high-resistance malfunction" here is to be understood as a malfunction that significantly increases the electrical resistance of the connecting line in comparison with its normal, fault-free operating state, which in particular includes the case in which the connecting line is completely interrupted.

In a further embodiment of the invention, the circuit arrangement contains a common connecting plug for the simultaneous releasable coupling of the connecting line monitoring circuit to the second end of the outer conductor and of the conductor signal input to an end of the inner conductor that faces away from the coupling electrode. In this way, for example, the fault case can be excluded in which, while the conductor signal input has indeed been connected to the inner conductor, additionally the connecting of the outer conductor to the connecting line monitoring circuit has however been forgotten.

In a further embodiment of the invention, the connecting line monitoring circuit is connected via an earth connection to an earth potential and configured to detect a deviation of the potential on the earth connection. In this realization, the connecting line monitoring circuit can thus also detect a high-resistance malfunction of its earth connection. The term "high-resistance malfunction" here is to be understood as a malfunction that significantly increases the electrical resistance of the earth connection in comparison with its normal, fault-free operating state, which in particular includes the case in which the earth connection is completely interrupted.

An advantageous embodiment of the invention is shown in the drawing. This and other advantageous embodiments of the invention are explained in more detail below.

BRIEF DESCRIPTION OF THE DRAWING

FIG. 1 shows a schematic circuit diagram of a circuit arrangement for voltage testing and partial discharge capture in a single-phase or multi-phase medium-voltage or high-voltage installation.

DETAILED DESCRIPTION OF THE DRAWING

The circuit arrangement shown in the single FIG. 1 in an exemplary embodiment is designed for voltage testing and partial discharge capture in a single-phase or multi-phase medium-voltage or high-voltage installation. It comprises for this purpose one or a plurality of conductor signal inputs, each of which is configured for coupling to a respective capacitive coupling electrode that is coupled to a respective conductor of the single-phase or multi-phase medium-voltage or high-voltage installation. The circuit arrangement in FIG. 1 is, by way of example, shown coupled to three conductors L1, L2, L3 of a three-phase medium-voltage or high-voltage installation with a capacitive coupling electrode $2_1$, $2_2$, $2_3$ coupled to each. The circuit arrangement here is coupled to a respective conductor signal input $1_1$, $1_2$, $1_3$ at the respective coupling electrode $2_1$, $2_2$, $2_3$ of the respective conductor L1, L2, L3.

The circuit arrangement shown contains in each case a voltage testing unit 3 coupled on the input side to the assigned conductor signal input $1_1$, $1_2$, $1_3$ and configured for threshold-based voltage state capture with respect to the assigned conductor L1, L2, L3. For this purpose, the voltage testing unit 3 preferably has a circuit structure as is known per se for voltage testing units that work in accordance with the standard IEC61243-5, which therefore does not require any more detailed explanations here.

The circuit arrangement shown furthermore comprises at least one partial discharge detector unit 4 configured for partial discharge detection with respect to the assigned conductor L1, L2 and/or L3 and comprising a partial discharge detector circuit 5 and a partial discharge display circuit 7 coupled on an input side to a signal output 6 of the partial discharge detector circuit 5.

The circuit arrangement shown also contains an energy supply for the partial discharge detector unit 4, wherein this energy supply comprises a first energy supply circuit 8 and/or a second energy supply circuit 9. The first energy supply circuit 8 is configured to supply the partial discharge detector circuit 5 with energy from the conductor signal input or one of the conductor signal inputs $1_1$, $1_2$, $1_3$ of the circuit arrangement, and the second energy supply circuit 9 is configured to supply the partial discharge display circuit 7 with energy from the conductor signal input or one of the conductor signal inputs $1_1$, $1_2$, $1_3$ of the circuit arrangement. As in the example shown, in advantageous embodiments this energy supply comprises both the first and the second energy supply circuit 8, 9, while in alternative embodiments only one of these two energy supply circuits 8, 9 is provided. The first and the second energy supply circuits 8, 9 have a circuit structure that provides the respective functionality required of them. In this respect, suitable circuit realizations are known per se to the person skilled in the art with knowledge of this functionality given in the present case, which therefore does not require any more detailed explanations here.

The circuit arrangement is shown in FIG. 1 in more detail with its components coupled to the conductor L1. In the same way, the circuit arrangement can comprise circuit components that are coupled to the conductor L2 or to the conductor L3, for example in each case a further voltage testing unit 3, as indicated in FIG. 1. Since these further circuit components can be implemented in an identical manner to the shown circuit components coupled to the conductor L1, the description of the shown circuit components below is sufficient. It is in particular possible in appropriate embodiments to provide the voltage testing unit 3 for all three phases, i.e. in a three-phase manner, and to provide the partial discharge detector unit 4 only for one phase, i.e. in a single-phase manner.

In suitable embodiments, as in the example shown, the voltage testing unit 3 has a voltage testing circuit 16, for example in the form of a suitable conventional threshold detector, coupled on an input side to the assigned conductor signal input $1_1$, $1_2$, $1_3$, and a voltage state display circuit 18, for example in the form of a liquid-crystal display (LCD) known per se for this purpose, coupled on an input side to a signal output 17 of the voltage testing circuit 16. In addition, the measurement signal supplied on the input side via the conductor signal input $1_1$, $1_2$, $1_3$ can be fed in parallel to an external measuring point 19 of the voltage testing unit 3, as shown.

The circuit arrangement further comprises a partial discharge connection path 37 configured to couple an input side 5a of the partial discharge detector circuit 5 to an earth side 39 of an installation system capacitance $C_{S1}$, $C_{S2}$, $C_{S3}$ that is electrically parallel to the respective capacitive coupling electrode $2_1$, $2_2$, $2_3$. This enables the capture of partial discharges by means of the partial discharge detector unit 4 at the installation system capacitance $C_{S1}$, $C_{S2}$, $C_{S3}$ that is electrically parallel to the capacitive coupling electrode $2_1$, $2_2$, $2_3$ via the partial discharge connection path 37. The respective installation system capacitance $C_{S1}$, $C_{S2}$, $C_{S3}$ is in particular composed of electrical capacitances of cables, lines and terminations, in particular plug-in terminations in the surroundings of the relevant capacitive coupling electrode $2_1$, $2_2$, $2_3$ of the system of the medium-voltage or high-voltage installation, and arises to a significant extent in particular if a high-voltage cable is connected at a switchgear field of the medium-voltage or high-voltage installation and the capacitive coupling electrode $2_1$, $2_2$, $2_3$ is dimensioned with a relatively small capacitance, such that the installation system capacitance is greater than the capacitance of the coupling electrode $2_1$, $2_2$, $2_3$. Capacitances that result from field control coverings of high-voltage cable connectors and/or from shield covers of high-voltage cables contribute in particular to this, and are always present in a medium-voltage installation as soon as the medium-voltage cable is connected to the installation. It has been shown that it is precisely also in such cases that the partial discharge capture via the earth side 39 of this installation system capacitance $C_{S1}$, $C_{S2}$, $C_{S3}$ can be superior to a partial discharge capture via the capacitive coupling electrode $2_1$, $2_2$, $2_3$.

In advantageous embodiments, the circuit arrangement comprises a changeover switch 25 for the switchable connection of the input side 5a of the partial discharge detector circuit 5 either to the partial discharge connection path 37 or to the conductor signal input or one of the conductor signal inputs $1_1$, $1_2$, $1_3$. This allows the user to switch, when desired, between the partial discharge capture at the respective installation system capacitance $C_{S1}$, $C_{S2}$, $C_{S3}$ via the partial discharge connection path 37 and a partial discharge capture at the relevant capacitive coupling electrode $2_1$, $2_2$, $2_3$ via the associated conductor signal input $1_1$, $1_2$, $1_3$, and thereby to adjust optimally in each case to the situation and/or installation.

So, switchgear fields in the form of what are known as reserve fields, which are operated at least temporarily without a high-voltage cable, are typically present in high-voltage installations. In these fields the capacitance of the relevant coupling electrode $2_1, 2_2, 2_3$, via which corresponding signals can also be coupled in from the respective other conductors, primarily acts for coupling out the partial discharge signal. Therefore in this case the coupling of the partial discharge detector circuit 5 to the relevant conductor signal input $1_1, 1_2, 1_3$ is usually expedient. In general, this changeover of the partial discharge capture to the relevant conductor signal input $1_1, 1_2, 1_3$, for example the conductor signal input $1_1$, is indicated if it can be assumed that the partial discharge is coupled via all the conductors L1, L2, L3 sufficiently well through adequately large capacitances of the coupling electrodes $2_1, 2_2, 2_3$ that an adequately large partial discharge signal level arrives via the associated conductor signal input, such as the conductor signal input $1_1$, and its connection to the corresponding coupling electrode, such as the coupling electrode $2_1$, regardless of which of the conductors L1, L2, L3 the partial discharge originally comes from. If, on the other hand, it is assumed that the capacitances of the coupling electrodes $2_1, 2_2, 2_3$ are not sufficiently large for this kind of partial discharge signal coupling, it is possible to switch to the partial discharge capture at the respective installation system capacitance $C_{S1}, C_{S2}, C_{S3}$ via the partial discharge connection path 37. This can, for example, be the case when a high-voltage cable is connected to the switchgear field, whereby additional cable capacitances or capacitances of the terminations that attenuate or absorb the high-frequency partial discharge signal come into effect. This effect is particularly noticeable when the capacitance of the coupling electrodes $2_1, 2_2, 2_3$ is relatively low.

In advantageous embodiments, the circuit arrangement comprises, for one, two or, as in the example shown, for all three phases, a respective coaxial line 31 with an inner conductor 32 that forms at least a part of a connecting line 30 from the respective conductor signal input $1_1, 1_2, 1_3$ to the assigned capacitive coupling electrode $2_1, 2_2, 2_3$, and an outer conductor 33 that surrounds the inner conductor 32 and forms at least a part of the partial discharge connection path 37. The outer conductor 33 can thereby function as a coupling or connecting line via which the partial discharge detector circuit 5 can be coupled to the earth side 39 of the installation system capacitance $C_{S1}, C_{S2}, C_{S3}$. In an alternative embodiment, the partial discharge connection path 37 contains an independent coupling line 51, indicated by dots in FIG. 1, for coupling the partial discharge detector circuit 5 to the earth side 39 of the installation system capacitance $C_{S1}, C_{S2}, C_{S3}$, instead of using the outer conductor 33 for this purpose. This embodiment is accordingly also possible if the coaxial line 31 is not provided. On the other hand, through the use of the coaxial line 31, the sensitivity of the partial discharge detection on the relevant phase can be improved if the partial discharge detector circuit 5 is connected to the associated conductor signal input $1_1, 1_2, 1_3$ and thereby to the inner conductor 32.

In the example shown, the outer conductor 33 at a first end 33a that faces towards the coupling electrode is earthed together with the earth side 39 of the respective installation system capacitance $C_{S1}, C_{S2}, C_{S3}$, i.e. together with an earth line of the respective installation system capacitance $C_{S1}, C_{S2}, C_{S3}$, i.e. connected to an earth potential 36. In addition, an end 32a of the inner conductor 32 that faces towards the coupling electrode is connected to the earth potential 36 together with the assigned coupling electrode $2_1, 2_2, 2_3$ via a voltage-limiting predetermined breaking point 35. In advantageous three-phase realizations, the earth sides 39 of all three installation system capacitances $C_{S1}, C_{S2}, C_{S3}$ are, as in the example shown, connected together and to the earth potential 36 via a common earth line 52. Alternatively, they can be connected to the earth potential 36 individually, separately from one another.

In corresponding embodiments, as in the example shown, the earth side 39 of the relevant installation system capacitance $C_{S1}, C_{S2}, C_{S3}$ and the partial discharge connection path 37 coupled to this are connected to the earth potential 36 via a high-frequency blocking element 40. The high-frequency blocking element 40 can be an inductor or another conventional electrical component that prevents high-frequency signals and, in particular, the partial discharge signal being diverted via the earth potential 36, wherein this function can possibly also be effectuated by an appropriately designed connecting line alone. This can contribute to improved detection of the partial discharge signal by the coupled partial discharge detector circuit 5. In the example shown, the high-frequency blocking element 40 is connected jointly for the three earth sides 39 of the installation system capacitances $C_{S1}, C_{S2}, C_{S3}$ between the common earth line 52 and the earth potential 36, while in alternative embodiments without the common earth line 52 a respective high-frequency blocking element 40 is located between the earth side 39 of the respective installation system capacitance $C_{S1}, C_{S2}, C_{S3}$ and the earth potential 36.

In the exemplary embodiment shown, the first energy supply circuit 8 is coupled to the same conductor signal input $1_1, 1_2, 1_3$ of the circuit arrangement as the partial discharge detector unit 4, in particular to the conductor signal input $1_1$ leading to the conductor L1. In alternative embodiments of the circuit arrangement that are not shown, the first energy supply circuit 8 is coupled to a different one of the plurality of conductor signal inputs $1_1, 1_2, 1_3$ of the circuit arrangement than the assigned partial discharge detector unit 4 whose partial discharge detector circuit 5 is supplied by the first energy supply circuit 8.

In the same way, in the exemplary embodiment shown, the second energy supply circuit 9 is coupled to the same conductor signal input, the conductor signal input $1_1$ by way of example, of the circuit arrangement as the assigned partial discharge detector unit 4, whose partial discharge display circuit 5 is supplied by the second energy supply circuit 9. In alternative embodiments, the second energy supply circuit 9 is coupled to a different one of the plurality of conductor signal inputs $1_1, 1_2, 1_3$ than the relevant partial discharge detector unit 4.

In an advantageous realization, for example, the partial discharge detector unit 4 can be connected to the first conductor L1, the first energy supply circuit 8 to the second conductor L2, and the second energy supply circuit 9 to the third conductor L3 of the three-phase medium-/high-voltage installation, in particular for the case in which only a single partial discharge detector unit 4 is used for this three-phase system. Preferably here three voltage testing units 3 are present, one each for each of the three conductors L1, L2, L3.

In advantageous embodiments, the circuit arrangement, as in the example shown, contains a variable capacitor 10 to form a capacitive voltage divider with the assigned capacitive coupling electrode $2_1, 2_2, 2_3$. The associated conductor signal input $1_1, 1_2, 1_3$ then forms the centre tap of this capacitive voltage divider. The signal of the relevant phase, or of the relevant conductor L1, L2, L3, is divided down to a low-voltage level on the measurement signal by the capacitive voltage divider. The variable capacitor 10 can be used to set the response threshold for the capacitive voltage display effectuated by the voltage testing unit 3 and, at the same time, preferably while maintaining the response thresholds specified for the voltage display in the standard IEC61243-5, to adjust the sensitivity of the partial discharge capture by the partial discharge detector unit 4 variably. The partial discharge detection can be made less sensitive by enlarging the capacitance of the variable capacitor 10, or made more sensitive by reducing this capacitance.

The partial discharge detector circuit 5 has a circuit structure as is known per se for the desired functionality which does not require any more detailed explanations here, for example using a high-pass or band-pass circuit. If the presence of a partial discharge is detected by the partial discharge detector circuit 5, for example as a result of reaching a predefined partial discharge level, the partial discharge detector circuit 5 outputs a detection signal at its signal output 6 which activates the partial discharge display circuit 7 to generate corresponding display information.

In advantageous realizations, the partial discharge display circuit 7 comprises, as in the example shown, a display unit 13 and a controllable switch 14 connected between the display unit 13 and the second energy supply circuit 9, such as a semiconductor switch implemented, for example, as a field-effect transistor, wherein this controllable switch 14 is coupled to a control input 15 at the signal output 6 of the partial discharge detector circuit 5.

In advantageous realizations of the circuit arrangement, the partial discharge detector unit 4 is made to have an adjustable sensitivity. In the example shown, the partial discharge detector unit 4 comprises for this purpose a circuit component 11 coupled to the signal output 6 of the partial discharge detector circuit 5 and comprising in the case shown a potentiometer, or alternatively a variable capacitor. This circuit component 11 enables a separate adjustment of the sensitivity of the partial discharge detector unit 4, i.e. a variable adjustment of its response threshold, independently of the setting of the response thresholds for the voltage testing unit 3 by means of the variable capacitor 10.

In advantageous embodiments, the partial discharge detector unit 4 comprises, as in the example shown, a deactivation element 12 with which the partial discharge detector unit can be deactivated without the voltage testing unit 3 coupled to the same conductor signal input $1_1$, $1_2$, $1_3$ of the circuit arrangement also thereby being deactivated. In the example shown, a switch that can be actuated by the user, that is connected between the signal output 6 of the partial discharge detector circuit 5 and an earth connection 20, serves as the deactivation element 12. The switch is open during active operation of the partial discharge detector unit 4, and it can be closed by the user to deactivate the partial discharge detector unit 4.

In corresponding realizations of the circuit arrangement, the partial discharge detector unit 4 has, as an alternative or, as shown, in addition to the controllable switch 14, a controllable switch 21, for example a semiconductor switch again. The switch 21 is connected on one side to the earth connection 20 and on the other side, as shown, directly or, alternatively, indirectly via a coupling relay, to a terminal 22 that, for example, enables the connection to a remote control substation of a conventional type, in order to transmit the partial discharge detection information by remote communication, and in this way functions as a detection information terminal. The output signal of the partial discharge detector circuit 5 is applied to a control input of this switch 21. Alternatively, the output signal of the switch 21 can also be used inside the circuit arrangement or the device that forms this for the connection of a remote transmission circuit, for example by means of a radio transmitter, in order for the partial discharge signal to be reported by radio from the device to a remote control system.

In the exemplary embodiment shown, the display unit 13 for displaying the information regarding the partial discharge detection and the voltage state display circuit 18 are implemented as separate display units, preferably both in the form of respective suitable LCD display units. In alternative embodiments, the partial discharge display circuit 7 and the voltage state display circuit 18 comprise a common display unit, again preferably an LCD display unit.

Depending on the need and the application, the partial discharge detector circuit 5 contains a single threshold detector with a predefined threshold value or a plurality of threshold detectors arranged in parallel with different threshold values. In the latter case, not only is a binary display regarding the presence or absence of a partial discharge possible, but also the detection or evaluation with respect to partial discharge threshold values of different levels, and through appropriately adapted implementation of the partial discharge display circuit 7 a separate display of the respectively present partial discharge threshold value or partial discharge level can be made, i.e. a partial discharge display with more than two levels.

The circuit arrangement according to the invention enables the combined partial discharge capture and voltage testing by means of a single test device, for which purpose the circuit arrangement can, for example, be housed in a common housing 23, as is illustrated schematically in FIG. 1. The circuit arrangement dispenses with a strict separation of the high-frequency and low-frequency components of the measurement signal at the respective conductor signal input $1_1$, $1_2$, $1_3$, which makes it easier to draw the energy necessary for the evaluation of the high-frequency signal component for the purpose of partial discharge capture as well as the energy required for the display of the detected information from the low-frequency signal component. Here in the case in which the partial discharge detector circuit 5 is coupled to the relevant conductor signal input $1_1$, $1_2$, $1_3$, it is helpful for the partial discharge detector circuit 5 to be dimensioned with a sufficiently high resistance, which also contributes to the fact that the response behaviour of the voltage testing unit 3 is not significantly changed by the presence of the partial discharge detector unit 4.

In advantageous embodiments, the circuit arrangement, as in the example shown, comprises a diagnostic terminal 24 that is connected to the signal output of the partial discharge detector circuit 5, wherein this connection is preferably made directly, i.e. without the presence of other circuit components in between. Through the diagnostic terminal 24, which, like the detection information terminal 22, is preferably located at the housing 23 so as to be accessible from the outside, and, like this, can be implemented, for example, as a terminal socket, the associated partial discharge signal present at the signal output 6 of the partial discharge detector circuit 5 can be accessed when the presence of a partial discharge is detected, for example in order to be able to investigate it externally by means of an oscilloscope or the like for the purpose of diagnosing the cause of the partial discharge. The signal is accessed here behind the partial discharge detector circuit 5 implemented, for example, as a high-pass filter and can be correlated with 50 Hz oscillations at the external measuring point 19 of the voltage testing unit 3. This makes it possible to detect on which phase the partial discharge is being generated. In alternative embodiments, the diagnostic terminal 24 is absent, wherein in this case the detection information terminal 22 can, if necessary, be used to access corresponding partial discharge information in order to examine this externally. In further alternative embodiments, the detection information terminal 22 is absent, and the diagnostic terminal 24 takes over its above-mentioned functions.

In advantageous embodiments, the circuit arrangement in this case comprises a connecting line monitoring circuit 38 for at least one of the three phases, or in association with at least one of the coaxial lines 31, which can be coupled to a second end 33b of the outer conductor 33 that faces away from the coupling electrode and is configured to detect a deviation of the potential on the outer conductor 33 and thus to monitor the fault-free state of the connection. On the device side, a common screen connecting point 28, or a corresponding separate screen connecting point for each phase, can be used for connection of the outer conductor or conductors 33, also referred to as screens. If no connecting line monitoring circuit 38 is coupled to the outer conductor 33 of the respective coaxial line 31 for one phase, the outer conductor 33 can be earthed at its end 33b that faces away from the coupling electrode, for example in that it is taken to an earth potential 50. The screen connecting point 28 can also, as in the example shown, be used as the input terminal of the circuit arrangement for coupling the partial discharge detector circuit 5 to the partial discharge connection path 37 leading to the earth side 39 of the relevant installation system capacitance $C_{S1}$, $C_{S2}$, $C_{S3}$.

The connecting line monitoring circuit 38 is able to detect a high-resistance malfunction of the outer conductor 33, which in particular can be caused by a conductor break of the coaxial line 31, and which typically is also associated with a high-resistance malfunction of the inner conductor 32 and thereby of the connecting line 30. The connecting line monitoring circuit 38 can preferably be housed in the common housing 23 together with the other components mentioned of the circuit arrangement, as in the example shown.

In corresponding realizations, a common connecting plug 34, indicated schematically in FIG. 1, is provided for the simultaneous releasable coupling of the connecting line monitoring circuit 38 to the second end 33b of the outer conductor 33 and of the conductor signal input 1 to an end 32b of the inner conductor 32 that faces away from the coupling electrode. In an advantageously simple manner, an incorrect display is thereby avoided, that could result from the fact that, while the relevant conductor signal input $1_1$, $1_2$, $1_3$ has indeed been connected to the inner conductor 32, the connecting line monitoring circuit 38 has however accidentally not been connected to the outer conductor 33.

In corresponding realizations, the connecting line monitoring circuit 38 is, as in the example shown, connected via an earth connection 49 to the earth potential 50 and configured to detect a deviation of the potential on the earth connection 49. The connecting line monitoring circuit 38 is thereby also able to detect a high-resistance malfunction in its earth connection 49.

In advantageous realizations, the connecting line monitoring circuit 38 comprises, as in the example shown, a display element 41 and two switching transistors T1, T2, whose switched segments are connected in parallel between the display element 41 and an earth point 42 that represents an earth potential on the circuit side. The monitoring circuit 38 is supplied by an auxiliary voltage supply 43 that can be activated by the user, which can, in a manner known per se, be for example a piezo element or another element that converts mechanical energy into electrical energy. Actuation of this auxiliary voltage supply 43 by a user initiates a corresponding monitoring test procedure.

A control terminal 44 of the first switching transistor T1 is coupled to the end 33b of the outer conductor 33 of the coaxial line 31 that faces away from the coupling electrode, preferably, as in the example shown, via an optional coupling circuit with an inductor 29. A control terminal 47 of the second switching transistor T2 is coupled to the earth connection 49. The circuit-side earth point 42 is connected via a respective resistor R1, R2 to the control terminal 44, 47 of the first or second switching transistor T1, T2.

The monitoring circuit 38 implemented in this way forms, together with the outer conductor 33 of the coaxial line 31, an installation monitoring means through which a high-resistance malfunction of the connection between the respective conductor L1, L2, L3 and the voltage testing unit 3 and also the partial discharge detector unit 4, as well as a high-resistance malfunction of the earthing of the monitoring circuit 38, can be detected. In the absence of a fault, the outer conductor 33, and thereby also the control electrode 44 of the first switching transistor T1, lies continuously at the earth potential 36. Due to the earth connection 49 of the monitoring circuit 38, the circuit-side earth point 42 also lies continuously at the earth potential 36 or 50. The first switching transistor T1 thereby adopts its blocking state. The same applies to the second switching transistor T2. When a monitoring test process is triggered by activation of the auxiliary voltage supply 43, the display element 41 therefore remains deactivated.

If, on the other hand, a line break occurs in the coaxial line 31 or another high-resistance malfunction occurs on the outer conductor 33, the earthing for the control electrode 44 of the first switching transistor T1 is lost, whereby the first switching transistor T1 changes into its conductive state. It thereby closes a current path between the monitoring display element 41 and the earth point 42, with the consequence that the monitoring display element 41 is activated when a monitoring test process is initiated. The presence of an installation fault can be recognized from the activated monitoring display element 41. The same fault display results for the case in which the plug-in connection through the connecting plug 34 has not been properly established. This is because in this case too the control electrode 44 of the first switching transistor T1 is not continuously connected to the earth potential and remains at a floating potential, so that the first switching transistor T1 is switched into its conductive state. In other words, the monitoring circuit 38 recognizes the interruption of the outer conductor 33 from a difference in potential between the earth points or earth potentials 36 and 50.

The case in which the monitoring circuit 38 is not coupled, or not properly coupled, through its earth connection 49 to the earth potential 50 can be recognized as a further installation fault by the second switching transistor T2. In this case the continuous connection of the control electrode 47 of the second switching transistor T2 to the earth potential is lost, whereby the second switching transistor T2 is placed into its conductive state and this now provides a display current path between the monitoring display element 41 and the earth point 12.

The two switching transistors T1, T2 operate independently of one another, which means that the monitoring circuit 38 is able to recognize the installation faults described in relation to the test signal connecting line 30 on the one hand and the earthing of the monitoring circuit 38 on the other hand both individually and in combination, and to display them via the display element 41. This concerns an incomplete installation resulting from a connection via the connecting plug 34 not having been established, an incomplete installation resulting from an absent or inadequate earth connection of the monitoring circuit 38, and a conductor break or high-resistance malfunction of the coaxial line 31. The first transistor switch T1 functions here with the associated peripheral circuit component as a test signal connecting line monitoring circuit component, while the second transistor switch T2 functions with the associated peripheral circuit component as an earth connection monitoring circuit component. The outer conductor 33 functions as a monitoring line extending along the inner conductor and thereby the test signal connecting line 30 which is connected at its end 32a that faces towards the coupling electrode to the earth potential 36 and is coupled at its other end 32b via the optional connecting plug 34 and the optional coupling circuit with the inductor 29 to the connecting line monitoring circuit 38. The inductor 29 functions as a high-frequency filter to avoid a short circuit of the high-frequency partial discharge signal in the direction of the monitoring circuit 38.

Although this has not yet been explicitly mentioned, it is clear that the voltage test system shown can be designed in the usual way for testing the voltage of three-phase high voltage and the monitoring and voltage testing described can be provided for each of the three phases. It is advantageous in this case to provide a common connecting point for all three phases and the respective monitored coaxial cable screen or outer conductor 33 through an appropriately implemented plug-in connector. Whether an installation fault is present is first established by the installation monitoring measure. If no installation fault is present, the voltage testing unit 3 can carry out the normal voltage testing for the high-voltage line that is to be monitored.

With the conductor break capture by the monitoring circuit 38 it can generally be assumed that a conductor break of a three-phase voltage testing system is critical when all three test signal connecting lines 30 of a three-phase system are interrupted, since in this state a conductor break would not be distinguished from the "no voltage" state, whereas in the case of a conductor break of a single connecting line the other connecting lines would still carry a signal and indicate the "voltage present" state. A three-phase installation is only considered to have "no voltage" when the absence of voltage is detected for all three phases. For this reason, monitoring only one coaxial connecting line is generally already sufficient for the conductor break capture.

As the exemplary embodiment shown and the further exemplary embodiments explained above make clear, the invention makes a circuit arrangement available that fulfils the known monitoring tasks of the partial discharge capture and the voltage testing in medium-/high-voltage installations in a highly advantageous manner and which can be realized with a relatively low circuit complexity in a single device combining these functions and which, if desired, manages without any auxiliary energy either for the voltage testing or for the partial discharge capture. The partial discharge capture can be automatically limited to the interesting periods of time in which an active measurement signal is present for the voltage testing. During other periods of time, the partial discharge capture can be kept inactive through the absence of energy supply due to the absence of the measurement signal. To perform the partial discharge capture, the associated partial discharge detector unit can be coupled to the earth side of one or a plurality of the installation system capacitances that are parallel to the capacitive coupling electrodes and preferably also switchably to at least one of the capacitive coupling electrodes. Optionally, a conductor break detection system can additionally be provided as an integral element of the circuit arrangement. The circuit arrangement can be realized in a common device or device housing.

What is claimed is:

1. A circuit arrangement for voltage testing and partial discharge capture in a single-phase or multi-phase medium-voltage or high-voltage installation, comprising:
   one or a plurality of conductor signal inputs, each of which is configured for coupling to a respective capacitive coupling electrode that is coupled to a respective conductor of the single-phase or multi-phase medium-voltage or high-voltage installation;
   at least one voltage testing unit coupled on an input side to the or an assigned one of the conductor signal inputs of the circuit arrangement and configured for threshold-based voltage state capture with respect to the assigned conductor;
   at least one partial discharge detector unit configured for partial discharge detection with respect to the conductor or an assigned one of the conductors and comprising a partial discharge detector circuit and a partial discharge display circuit coupled on an input side to a signal output of the partial discharge detector circuit;
   an energy supply for the partial discharge detector unit comprising at least one of: a first energy supply circuit configured to supply the partial discharge detector circuit with energy from the conductor signal input or one of the conductor signal inputs of the circuit arrangement or a second energy supply circuit configured to supply the partial discharge display circuit with energy from the conductor signal input or one of the conductor signal inputs of the circuit arrangement; and
   a partial discharge connection path configured to couple an input side of the partial discharge detector circuit to an earth side of an installation system capacitance that is electrically parallel to the capacitive coupling electrode.

2. The circuit arrangement according to claim 1, further comprising:
   a changeover switch for the switchable connection of an input side of the partial discharge detector circuit either to the partial discharge connection path or to the conductor signal input or one of the conductor signal inputs.

3. The circuit arrangement according to claim 1, further comprising:
   a coaxial line having an inner conductor that forms at least a part of a connecting line from the respective conductor signal input to the assigned capacitive coupling electrode, and an outer conductor that surrounds the inner conductor and forms at least a part of the partial discharge connection path.

4. The circuit arrangement according to claim 1, wherein the earth side of the installation system capacitance and the partial discharge connection path coupled thereto are connected to an earth potential via a high-frequency blocking element.

5. The circuit arrangement according to claim 2, wherein in a case in which the energy supply for the partial discharge detector unit includes the first energy supply circuit, the first energy supply circuit is capable to be coupled to the same conductor signal input of the circuit arrangement as the partial discharge detector unit or to another of a plurality of conductor signal inputs of the circuit arrangement.

6. The circuit arrangement according to claim 2, wherein in a case in which the energy supply for the partial discharge detector unit includes the second energy supply circuit, the second energy supply circuit is capable to be coupled to the same conductor signal input of the circuit arrangement as the partial discharge detector unit or to another of a plurality of conductor signal inputs of the circuit arrangement.

7. The circuit arrangement according to claim 1, further comprising:
a variable capacitor at the respective conductor signal input to form a capacitive voltage divider with the assigned capacitive coupling electrode.

8. The circuit arrangement according to claim 1, wherein the partial discharge detector unit comprises, for adjusting sensitivity, a circuit component coupled to the signal output of the partial discharge detector circuit and comprising a variable capacitor or a potentiometer or an adjustable resistor network.

9. The circuit arrangement according to claim 1, wherein the partial discharge detector unit comprises a deactivation element with which the partial discharge detector unit is capable to be deactivated independently of the voltage testing unit.

10. The circuit arrangement according to claim 1, wherein in a case in which the energy supply for the partial discharge detector unit includes the second energy supply circuit, the partial discharge display circuit comprises a display unit and a semiconductor switch connected between the display unit and the second energy supply circuit and coupled at a control input to the signal output of the partial discharge detector circuit.

11. The circuit arrangement according to claim 1, further comprising:
a detection information terminal for transmitting detection information of the partial discharge detector unit to the outside; and
a controllable switch that is connected to the detection information terminal, wherein a control input of the controllable switch is connected to the signal output of the partial discharge detector circuit.

12. The circuit arrangement according to claim 1, further comprising:
a diagnostic terminal that is connected to the signal output of the partial discharge detector circuit.

13. The circuit arrangement according to claim 1, wherein the respective voltage testing unit comprises a voltage testing circuit coupled on an input side to the assigned conductor signal input of the circuit arrangement, and a voltage state display circuit coupled on an input side to a signal output of the voltage testing circuit, and the partial discharge display circuit of the partial discharge detector unit and the voltage state display circuit of the voltage testing unit comprise a common display unit.

14. The circuit arrangement according to claim 2, further comprising:
a connecting line monitoring circuit that is couplable to a second end of the outer conductor facing away from the coupling electrode and is configured to detect a voltage potential deviation on the outer conductor.

15. The circuit arrangement according to claim 14, further comprising:
a common connecting plug for simultaneous releasable coupling of the connecting line monitoring circuit to the second end of the outer conductor as well as of the respective conductor signal input to an end of the inner conductor that faces away from the coupling electrode.

16. The circuit arrangement according to claim 14, wherein
the connecting line monitoring circuit is connected via an earth connection to an earth potential and configured to detect a voltage potential deviation on the earth connection.

* * * * *